United States Patent
Maeng

(10) Patent No.: US 6,313,652 B1
(45) Date of Patent: Nov. 6, 2001

(54) TEST AND BURN-IN APPARATUS, IN-LINE SYSTEM USING THE TEST AND BURN-IN APPARATUS, AND TEST METHOD USING THE IN-LINE SYSTEM

(75) Inventor: Ju Seok Maeng, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/219,241

(22) Filed: Dec. 22, 1998

(30) Foreign Application Priority Data

Dec. 26, 1997 (KR) .................................................. 97-74610

(51) Int. Cl.$^7$ .................................................. G01R 31/02
(52) U.S. Cl. ........................ 324/760; 324/765; 324/158.1; 209/574
(58) Field of Search .................................. 324/158.1, 755, 324/760, 765, 754; 209/574, 573, 571

(56) References Cited

U.S. PATENT DOCUMENTS

| 5,313,156 | * | 5/1994 | Klug et al. ......................... 324/158.1 |
| 5,865,319 | * | 2/1999 | Okuda et al. ......................... 209/574 |
| 6,104,183 | * | 8/2000 | Kobayashi et al. ............... 324/158.1 |

* cited by examiner

Primary Examiner—Ernest Karlsen
Assistant Examiner—Minh Tang
(74) Attorney, Agent, or Firm—Marger Johnson & McCollom, P.C.

(57) ABSTRACT

A test and burn-in apparatus for semiconductor chip package devices, an in-line system which includes the test and burn-in apparatus, and a test method which employs the in-line system are provided. A test and burn-in apparatus for testing semiconductor devices allows various testing processes, including a burn-in process, to be performed at the same testing stage. The apparatus employs test trays which contain the semiconductor devices. These test trays are used throughout the in-line system so that an entire back-end process can be performed without the need for loading/unloading the semiconductor devices into and from device trays between the various tests. The test and burn-in apparatus according to this invention can therefore occupy less space than the prior art testing apparatuses. The in-line system includes multiple test and burn-in apparatuses as well as a single sorting unit which performs a composite sorting operation after all the testing processes have been performed. Furthermore, the method for testing the semiconductor devices in the in-line system includes testing the semiconductor devices in the test trays using the test and burn-in apparatus, generating a test tray map corresponding to results of the test, transferring the test trays to a different testing apparatus for a second testing and test tray map generation process, and finally sorting the semiconductor devices in the sorting unit after all testing processes have been performed based on a final sorting map created by combining the test tray maps of each of the tests. The benefits of this invention are reduced time and space requirements because neither transferring the devices to device trays between tests nor performing multiple sorting steps are required.

10 Claims, 9 Drawing Sheets

FIG. 7

Table 122 (120):

|   | 1 | 2 | 3 | 4 | 5 | 6 | 7 | 8 |
|---|---|---|---|---|---|---|---|---|
| 1 | 1 | ∅ | 1 | 1 | 5 | 5 | 1 | 1 |
| 2 | 1 | 1 | 1 | 8 | 1 | 1 | 1 | 1 |
| 3 | 21 | 1 | 1 | 1 | 4 | 5 | 6 | 6 |
| 4 | 8 | 1 | 1 | 1 | 1 | 1 | 1 | 1 |
| 5 | 1 | 1 | 1 | 1 | 1 | 1 | 1 | 1 |
| 6 | 1 | 1 | 1 | 1 | 5 | 7 | 8 | 1 |
| 7 | 1 | 1 | 1 | 1 | 1 | 1 | 1 | 1 |
| 8 | 1 | ∅ | 1 | 1 | 1 | 1 | 1 | ∅ |

4ea

Table 124:

|   | 1 | 2 | 3 | 4 | 5 | 6 | 7 | 8 |
|---|---|---|---|---|---|---|---|---|
| 1 | 1(1) | 2($R_1$) | 3(3) | 2(2) | 3($R_1$) | 2(BGD) | 1(1) | 1(1) |
| 2 | 1(1) | 1(1) | 1(1) | 8($R_3$) | 1(1) | 1(1) | 1(1) | 1(1) |
| 3 | 2($T_{III}$) | 1(1) | 1(1) | 1(1) | 4($R_3$) | 5($R_3$) | 6($R_3$) | 6($R_3$) |
| 4 | 8($R_3$) | 1(1) | 1(1) | 1(1) | 1(1) | 1(1) | 1(1) | 1(1) |
| 5 | 1(1) | 1(1) | 1(1) | 1(1) | 1(1) | 8($R_2$) | 1(1) | 1(1) |
| 6 | 1(1) | 1(1) | 1(1) | 1(1) | 5($R_3$) | 1($R_1$) | 1($R_1$) | 1(1) |
| 7 | 1(1) | 1(1) | 1(1) | 1(1) | 1(1) | 1(1) | 1(1) | 1(1) |
| 8 | 1(1) | 1($R_1$) | ∅($R_2$) | 1(1) | 1(1) | 1(1) | 1(1) | ∅(Bonus) |

4ea

TEST AND BURN-IN APPARATUS, IN-LINE SYSTEM USING THE TEST AND BURN-IN APPARATUS, AND TEST METHOD USING THE IN-LINE SYSTEM

This application claims priority from Korean patent application No. 97-74610 filed Dec. 26, 1997 in the name of Samsung Electronics Co., Ltd., which is incorporated herein by reference for all purposes and Korean patent application No. 98-20842 filed on Jun. 5, 1998 in the name of Samsung Electronics Co., Ltd.

Additionally, this application corresponds to Korean patent application No. 97-12256 filed on Apr. 2, 1997 entitled "Method for Generating Lot in Semiconductor Test Process System" which is herein incorporated by reference for all purposes.

BACKGROUND OF THE INVENTION

1. Field of the Invention

The present invention relates generally to an apparatus and method for testing semiconductor devices. More particularly, the present invention relates to a test and burn-in apparatus for semiconductor chip package devices, an in-line system which includes the test and burn-in apparatus, and a test method which employs the in-line system.

2. Description of the Related Art

A manufacturing process for producing semiconductor devices generally includes three sub-processes: a wafer fabrication process; a package assembly process; and a back-end process. The wafer fabrication process encompasses the procedures for creating a large number of circuits on a thin disc, or wafer, of semiconductor material such as silicon. The package assembly process is the process by which an individual chip, having been separated from the wafer, is assembled into a package for establishing interconnections with a suitable operating environment. The back-end process includes several test steps where the packaged devices are tested to determine the parameters of the devices and whether the devices appropriately perform their intended function. The back-end process also includes sort steps in which the tested devices are sorted according to their individual parameters.

FIG. 1 is a flow chart illustrating a conventional back-end process 80 for manufacturing semiconductor devices 89. As shown in FIG. 1, the conventional back-end process 80 includes four test steps 81, 82, 83 and 84, three associated sort steps 91, 92 and 93, a marking step 85, a visual inspection step 86, a packing step 87, and a stocking step 88. The four test steps are performed in sequence and include a DC test 81, a burn-in step 82, a room/cold test 83, and a hot sort test 84.

The assembled semiconductor devices 89 are provided to the back-end process 80 in package form. Specifically, the assembled semiconductor devices 89 are loaded in a device tray and then provided to the DC test 81. The DC test 81 is performed to detect electrical failures which can occur during the package assembly process. After performance of the DC test 81, the first sort step 91 is engaged during which good devices in the device tray are transferred to a burn-in board, while failed devices are scrapped. The burn-in board, once supplied with the good devices, is transferred to the burn-in step 82.

The burn-in step 82 is an unusual test in which the semiconductor devices are subjected to extreme conditions (such as high temperature) in order to pre-screen out early device failures that might take place during actual usage. Following the burn-in step 82, the burn-in board is returned to the first sort step 91. The devices in the burn-in board are then sorted depending on the results of the burn-in step 82. The passing devices are again loaded in the device tray and transferred to the next test step. Although, for clarity, the first sort step 91 appears as a single block in FIG. 1, several processes are actually carried out during this step. Specifically, these processes include: moving the semiconductor devices from the device tray to the burn-in board and from the burn-in board back to the device tray; scrapping the failed devices after the DC test 81; and sorting the devices after the burn-in step 82. In most cases, both the first sort step 91 and the DC test 81 are carried out at the same stage of the manufacturing process.

Following the burn-in step 82, the room/cold test 83 is performed. The room/cold test 83 begins after the good devices stored in the device tray are transferred to a room/cold tester. The room/cold tester includes a handler which shifts the devices from the device tray to a test tray. The room/cold test 83 is carried out at either about 25° C. (room temperature) or below 0° C. (freezing), so that DC failures or function failures can be checked. As the room/cold test 83 operation is completed, the devices in the test tray are again sorted, this time based on the room/cold test results. The good devices are shifted to the device tray which will carry the devices to the next test step while the failed devices are scrapped. The second sort step 92 is carried out by the handler of the room/cold tester. As described above, the test tray of the room/cold tester is used to carry the devices to and from the contact parts of the tester, while the device tray carries the devices between two testers.

The good devices in the device tray, having been room/cold tested, are then transferred to the hot sort test 84, which is performed under high temperature conditions, i.e., approaching about 83° C. The hot sort test 84, as is widely known in the art, verifies the electrical or functional characteristics of the devices and determines their operational speed. Similar to the room/cold test 83, the hot sort test 84 includes the additional steps of removing the devices from the device tray and placing them in the test tray, and then removing them from the test tray and placing them on the device tray. Moving the devices from tray to tray is carried out by a handler (that is, by handling equipment) of the tester. The third sort step 93 is associated with the hot sort test 84 and is performed together with the shifting of the devices by the handler after completion of the hot sort test 84.

When new semiconductor material arrives to be tested in the back-end process, it is handled by lot ID number. A human operator typically needs to input the lot ID number into the system in order to generate a test result and to measure the output obtained from a given input. Between the loading and unloading of the semiconductor devices, there are several general steps which take place inside the handler regardless of the test function being performed. These general steps require time to perform. Specifically, test tray index time, soaking hot or cold temperature processing time and sorting time must all be included in the overall device loading/unloading time during transfer between trays. The time requirements are even worse when rework is required following the main process. The total processing time includes a lot of preparation time during handler processing, even before actually testing the devices and combining the output. Additionally, a human operator has to count the total output and record the test results on every lot traveller card.

Unfortunately, as indicated above, conventional testers require additional equipment for transporting between test steps and transferring between trays (handling) both the devices to be tested and those which have already been tested. Furthermore, shifting the devices between trays during every test step adds time and complexity but does not add any value in the performance of the tests. In other words, the complicated processes engaged in by the handler have no positive affects on the performance of the tests. In fact, the conventional handling requirements add cost and complexity to the semiconductor device manufacturing process without any corresponding benefits. Specifically, the prior art handlers increase significantly the space and time requirements for moving the devices through the back-end process, as well as the costs associated due to increased equipment requirements. Also, semiconductor devices being manipulated by the handler are faced with the possibility of considerable damage during movement between trays.

Another significant problem in the prior art is that the current burn-in testers require a long test time. The excessive test time is further compounded by the amount of time it takes to transfer the devices between the burn-in board and the device tray, the time it takes to load and unload the burn-in board, and the time it takes to raise or drop the test temperature and/or to check the burn-in process or signals. In addition, the burn-in board and its test sockets are high-priced expendables. Accordingly, all of the above-discussed testing steps—which are required for every semiconductor device—impose a heavy cost burden on the end-consumer.

Finally, typical burn-in testers perform at a slow test rate and a low test accuracy. The reason why the test rate of typical burn-in testers is slow is that test signals are applied in parallel to the devices in every row or every column through circuit patterns on the burn-in board. This testing technique makes it difficult to apply test signals to the specific device to be tested.

Furthermore, typical burn-in testers have a long serial scanning time when compared with normal testers. For example, JEC Co.'s burn-in tester model no. MBT P1700S has a test rate of 4 MHz maximum and a transition time of approximately 50ns, which represents a long cycle time. This tester is therefore capable of performing a few of the desired tests, such as a gross function test or a long cycle test, in addition to the burn-in step 82. It is unable, however, to perform either the room/cold test 83 or the hot sort test 84, both of which require shorter cycle testing times.

Another major problem in the prior art involves the prior art retest procedures. The prior art retest is a serial-type retest which means it is performed on the same machine as the initial test for each of the different test steps. Using this type of retest adds to the time requirements and complexity of the back-end process.

As a consequence of all of these drawbacks, it is considerably difficult to systemize the back-end process of the in-line system. Use of the prior art processes and equipment results in dropped productivity and lost cost-efficiency. Accordingly, improvements in the back-end process are extremely desirable in light of the industry desire for higher device throughput and lower manufacturing costs. In addition, it would be particularly desirable to eliminate the need for three separate sort steps, in order to further increase throughput and lower costs.

SUMMARY OF THE INVENTION

It is therefore an object of the present invention to provide an improved testing apparatus for semiconductor devices, which allows various tests of a back-end process, including a burn-in process, to be performed at the same platform.

It is another object of the present invention to provide a back-end process which uses an in-line system throughout the entire process and which employs more space-efficient equipment.

It is still another object of the present invention to provide an improved testing method which includes a burn-in process having a reduced number of steps, requires less time to perform, and uses equipment occupying less space.

It is yet another object of the present invention to provide a testing system which eliminates the unnecessary movement of semiconductor devices between trays by employing test trays which are directly transferable between test steps.

It is still another object of the present invention to provide a single composite sort step which eliminates the need for multiple sort steps between each of the various tests and burn-in processes.

It is yet another aspect of the present invention to provide a parallel-type retest, rather than a serial-type retest, which is independent of the testing machine and which uses previous test results and data automation to efficiently retest the devices.

These and other objects of the present invention are attained by using a test and burn-in apparatus for semiconductor devices. In particular, the test and burn-in apparatus in accordance with the present invention includes a rail for transferring multiple test trays, each of which contains multiple semiconductor devices to be tested. The apparatus also includes a loader for loading the test trays onto the rail and a unloader for unloading the test trays from the rail. Furthermore, the apparatus comprises a chamber, which the rail traverses. The test trays are provided in the chamber along the rail, so that the semiconductor devices contained in the test trays may be subjected to a test and/or burn-in process within the chamber. A plurality of test heads are formed in the chamber so that each test head can be electrically connected to a respective one of the test trays to perform the test and/or burn-in process for the semiconductor devices.

The apparatus may further include a main frame which includes a control unit which is electrically connected to the test heads. The main frame may further include a coolant refrigerator unit for cooling down the test heads. The number of test heads included is preferably either four or eight, with each test head capable of performing the test and/or burn-in process for sixty-four semiconductor devices in a single test tray. Preferably, the devices to be tested are semiconductor chip packages with gull-wing leads, or chip scaled packages.

According to an alternate aspect of the present invention, an in-line system is provided for manufacturing semiconductor devices. The in-line system includes a plurality of test and burn-in apparatuses, a transferring member, and a sorting unit. Each test and burn-in apparatus performs a different test and/or burn-in process from the other and includes a rail for transferring multiple test trays between processes. Each test tray holds a plurality of semiconductor devices. Each test and burn-in apparatus further includes a loader for loading the test trays onto the rail and a unloader for removing the test trays from the rail. Additionally, the rail traverses through a chamber in which the test or burn-in process takes place. Accordingly, the test trays travel in the chamber along the rail, and the plurality of semiconductor devices contained in the test trays are then subjected to the test or burn-in process.

A plurality of test heads are formed in the chamber where the test and/or burn-in process for the semiconductor devices is performed. Each of the test heads corresponds to a respective one of the test trays in the chamber, and each test head is electrically connected to its corresponding test tray. The transferring member receives the test trays from the unloader of one test and burn-in apparatus and supplies them to the loader of another test and burn-in apparatus. Accordingly, the test and burn-in apparatuses are linked in an in-line system by the transferring member. The semiconductor devices which pass all of the tests and burn-in processes of the in-line system are transferred to device trays from the test trays by a sorting unit.

Each test and burn-in apparatus in the in-line system further includes a main frame which includes a control unit electrically connected to the test heads. The control units and the sorting unit can be electrically connected to each other. The main frames can further include a coolant refrigerator unit for cooling down the test heads. The in-line system preferably includes four or eight test heads in each test and burn-in apparatus, with each head being capable of performing the test and/or burn-in process for sixty-four semiconductor devices in one test tray. The semiconductor devices are preferably semiconductor chip packages with gull-wing leads.

In particular, the in-line system according to this invention preferably includes a first test and burn-in apparatus for performing a DC test and a burn-in process, a second test and burn-in apparatus for performing a room/cold test, and a third test and burn-in apparatus for performing a hot sort test. Moreover, a sorting unit is preferably provided which can perform two operations: first, moving the devices which have already been tested from a test tray to a device tray; and second, providing new devices, which have not yet been tested, from a new device tray to the test tray.

According to still another aspect of the present invention, a method is provided for testing semiconductor devices. This method includes providing a test tray containing multiple semiconductor devices to a first test and burn-in apparatus. Next, a first testing process is performed on the semiconductor devices contained in the test tray in the first test and burn-in apparatus. The test tray is then transferred from the first test and burn-in apparatus to a second test and burn-in apparatus. A second testing process is then performed on the semiconductor devices contained in the test tray in the second test and burn-in apparatus. The test tray is next transferred from the second test and burn-in apparatus to a third test and burn-in apparatus. Subsequently, a third testing process is performed on the semiconductor devices contained in the test tray in the third test and burn-in apparatus. The test tray is then transferred from the third test and burn-in apparatus to a sorting unit where the semiconductor devices in the test tray are sorted based on the results of the three tests and delivered to a device tray during a sorting process.

The test and burn-in apparatuses and the in-line system described previously are preferably employed in carrying out this method, with each apparatus performing one of the three testing steps. Each of the transferring steps may be conducted by a transferring member which receives the test tray from the unloader of one apparatus and supplies it to the loader of the next apparatus, such that all of the apparatuses are linked together via the in-line system's transferring device.

In the previously described method, each test and burn-in apparatus can further include a main frame which includes a control unit electrically connected to test heads within the apparatus. Furthermore, the control units may be electrically connected to each other and to a sorting unit where the sorting process for sorting the semiconductor devices in the test tray is conducted. In particular, semiconductor device selection during the sorting process is preferably based on test tray maps which have been recorded as a result of the three testing steps and transmitted to the sorting step via the control units.

In addition, the method can further include loading new semiconductor devices contained in a new device tray into the test tray from which the tested semiconductor devices have just been sorted, and providing that test tray containing the new devices to be tested to the first test and burn-in apparatus for testing. Also, the first, second and third testing processes may include a burn-in process, a room/cold test and a hot sort test, in various orders. The third testing process is preferably the hot sort test, however.

BRIEF DESCRIPTION OF THE DRAWINGS

FIG. 7 is a view illustrating test tray maps employed in the back-end process of the present invention;

DETAILED DESCRIPTION OF THE PRESENT INVENTION

The preferred embodiments of the present invention will now be described more fully with reference to the accompanying drawings, in which like numerals represent like elements. It should be noted, however, that this invention may be embodied in many different forms and the claims should not be construed as being limited to the embodiments set forth in this description. Rather, these embodiments are provided by way of illustration only, so that the disclosure will be thorough and complete and convey the spirit but not scope of the invention to those skilled in the art. The scope is limited solely by the claims.

Various tests are required for ensuring the proper functioning of semiconductor devices. These tests are performed using one or more test and burn-in apparatuses in accordance with the present invention. In particular, the test and burn-in apparatuses (TABI) are so called because in the present invention, they enable a burn-in process in addition to the typical semiconductor device tests (i.e., a DC test, a room/cold test, and a hot sort test) to be performed in the same apparatus. Therefore, the testing apparatus of the invention will be referred as a test and burn-in (TABI) apparatus below.

Figure 1:
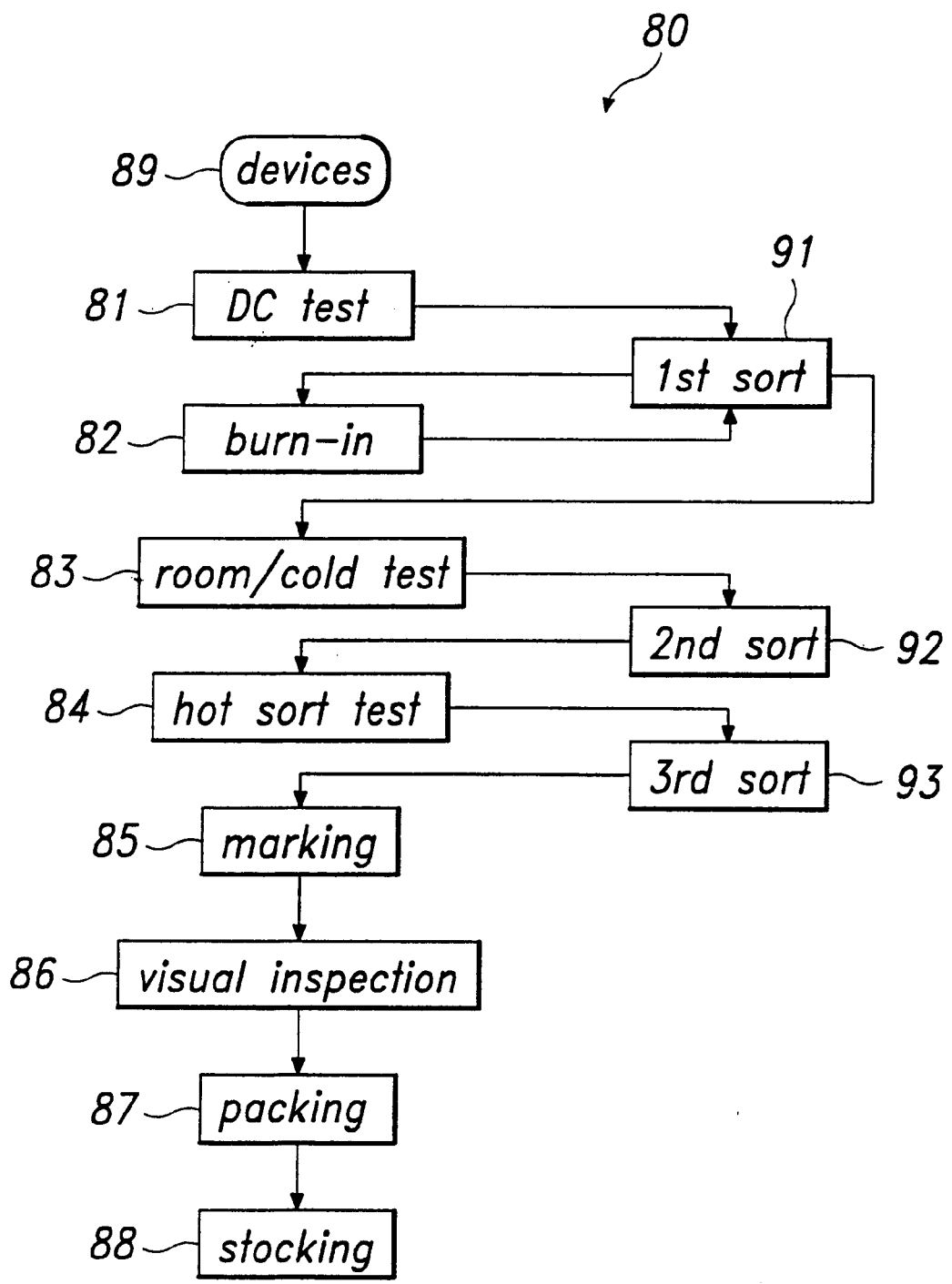
FIG. 1 is a flow chart illustrating a conventional back-end process for manufacturing semiconductor, devices.
Figure 2:
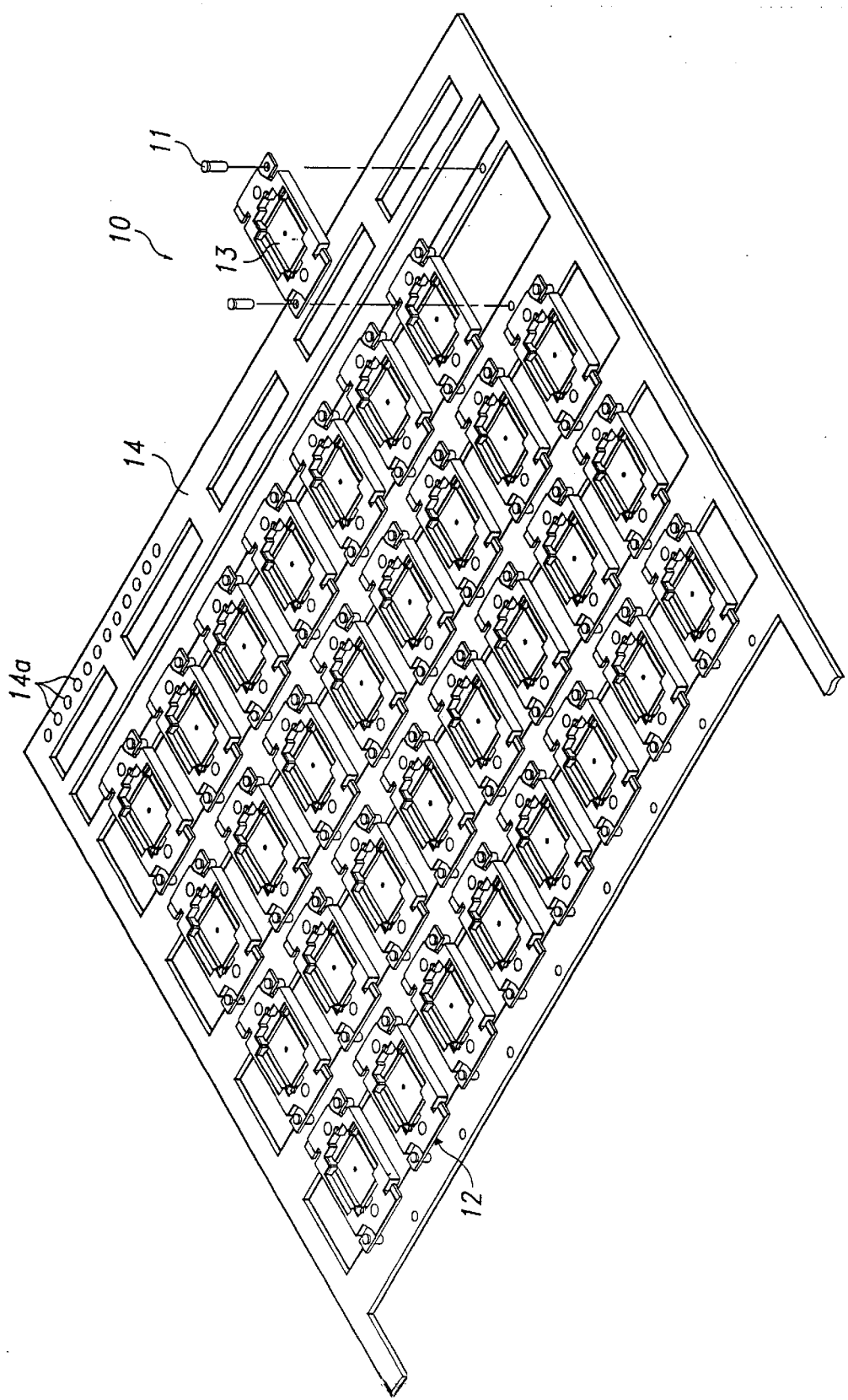
FIG. 2 is a perspective view of a test tray which can be used in accordance with a test and burn-in apparatus according to the present invention.
Figure 3:
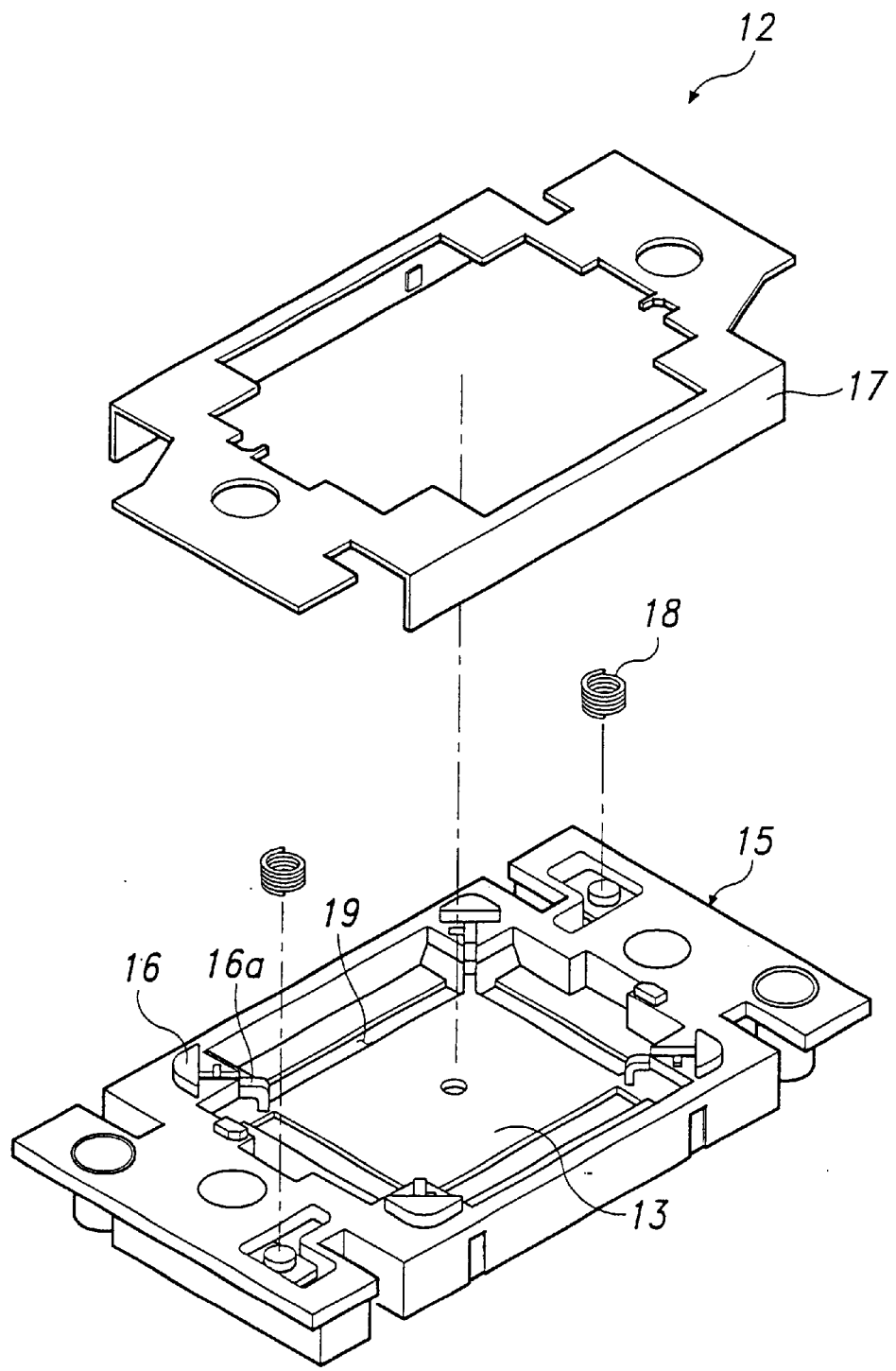
FIG. 3 is an exploded view of an insert of the test tray shown in FIG. 2.

FIG. 2 is a perspective view of a test tray 10 while FIG. 3 is an exploded view of an insert 12 of the test tray 10 shown in FIG. 2. Referring to FIGS. 2 and 3, the test tray 10 is employed to carry semiconductor chip packages throughout the back-end process. The test tray 10 can be designed to hold any type of chip device, however, the semiconductor chip packages preferably consist of gull-wing leads, such as quad flat packages (QFPs) or thin small outline packages (TSOPs). Additionally, chip scaled packages (CSPs) such as μBGA, which have been recently developed and proposed in the art, can be employed in the test tray 10.

The test tray 10 includes a plurality of inserts 12, provided within a tray frame 14, to contain the semiconductor devices. According to this embodiment, the test tray 10 has sixty-four inserts 12. However, test trays having a different number of inserts (i.e., one hundred twenty-eight, two hundred fifty-six, or five hundred twelve) can be used alternatively. Each insert 12, which is fixed (either removably or permanently) to the tray frame 14 by fasteners 11, accommodates one semiconductor device. Additionally, tray ID holes 14a are used to generate a tray ID number, a more detailed description of which will follow later.

The insert 12 is made of a body 15 and a pushing element 17. The pushing element 17 is elastically joined above the body 15 by springs 18. A pad 13, positioned in the center of the body 15, is formed for receiving and supporting the semiconductor chip package (i.e., a QFP or TSOP). The pad 13 is connected to the body 15 at its corners, with four slits 19 at its edges. Four latches 16 are also provided, corresponding to each of the corners of the pad 13. Each of the latches 16 has a hook 16a which is pivoted at a lower end of the latch 16.

By pushing down on the top of the pushing element 17, the latch 16, which is in contact with the bottom surface of the pushing element 17, is also moved downward, and the hook 16a is caused to rotate upwardly. The insert 12 can then receive the semiconductor device onto the pad 13. After the device is positioned, when the pushing force is removed, the pushing element 17 and the latch 16 are returned to their original position by the action of the springs 18. The hooks 16a are also returned to their original positions by rotating downwardly such that the device now located on the pad 13 is secured by the hooks 16a. Furthermore, leads of the device are exposed through the slits 19, so that the device can be tested through a contact between the device leads and a tester.

Figure 4:
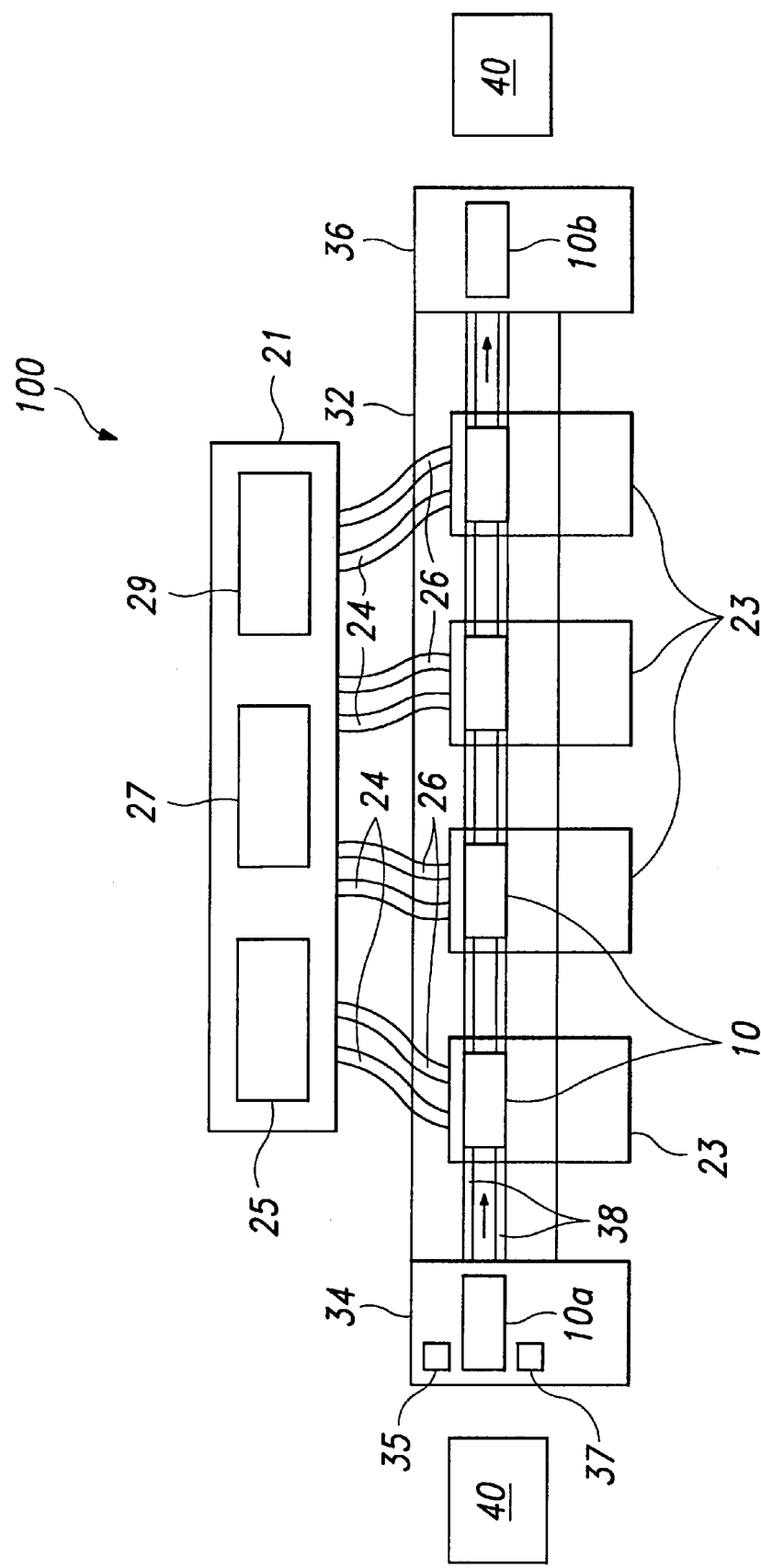
FIG. 4 is a schematic view of a first preferred embodiment of a test and burn-in apparatus in accordance with the present invention.

FIG. 4 is a schematic view of one embodiment of the test and burn-in (TABI) apparatus 100 in accordance with the present invention. As shown in FIG. 4, the TABI apparatus 100 includes a rail 38 for transferring test trays 10. Each test tray 10 contains a plurality of semiconductor devices which are to be tested. The TABI apparatus 100 further includes a loader 34 and an unloader 36 which are located, respectively, at both ends of the rail 38. New trays 10a, holding devices which have not yet been tested, are loaded onto the rail 38 by the loader 34. The unloader 36 is provided to unload tested trays 10b, containing already tested devices, from the rail 38. The new trays 10a, test trays 10 and tested trays 10b are the same test trays, but at different steps in the testing process.

A chamber 32, which at least partially encloses the rail 38, includes four test heads 23 which are formed in the chamber 32. The test trays 10 travel into the chamber 32 along the rail 38, and are then stopped for testing. Testing is performed by electrically connecting each of the semiconductor devices in one of the test trays 10 to one of the test heads 23. The chamber 32 applies heat or cooling to the test heads for a proper test and/or burn-in temperature. Accordingly, all of the devices in every test tray are subjected to a test and/or burn-in process within the chamber 32, by being electrically connected to the test heads 23.

The test heads 23 are also connected to a main frame 21 which includes a control unit 25, a coolant refrigerator unit 27, and a power source 29. The control unit 25 controls the functioning and sequence of the testing operations of the test heads 23. The power source 29 supplies electrical power to the test heads 23. Both the control unit 25 and the power source 29 are electrically connected to the test heads 23 by cables 24. The coolant refrigerator unit 27 is connected to the test heads 23 by hoses 26 and is thereby able to supply chilled water in order to cool down the test heads 23 (particularly on a high-speed board). A transferring member 40, such as a cart, receives the test trays 10 from the unloader 36 and then supplies them to the loader 34.

The TABI apparatus 100 according to this embodiment therefore permits the testing of two hundred and fifty-six semiconductor devices at a time, since the TABI apparatus 100 has four test heads 23, each of which is connected to one test tray 10 holding sixty-four semiconductor devices. However, by modifying the number of the test heads 23 and/or the number of devices per tray, the apparatus 100 can be configured to test more or less devices at a time, as desired. Additionally, while the TABI apparatus 100 of this embodiment has only one main frame 21 and one chamber 32, several other configurations are also possible. For example, two main frames and two chambers or one main frame and two chambers are other possible configurations.

Operation of the TABI apparatus 100 of this embodiment is as follows. First, the new trays 10a, holding the devices to be tested, are loaded onto the rail 38 from the transferring member 40 by the loader 34. Next, each new tray 10a moves along the rail 38 and into the chamber 32 and is located on one of the test heads 23. The test and/or burn-in process is then performed within the chamber 32 when the devices in the test trays 10 and the contact parts in the test head 23 are electrically connected to each other. The tested trays 10b, containing the tested devices, are then moved toward the unloader 36 along the rail 38. The tested trays 10b are unloaded from the rail by the unloader 36 and then transferred to the next process by the transferring member 40.

As described above, the ability to use the test trays themselves to transport the semiconductor devices through the entire testing process, without requiring transfer of the devices to and from device trays between tests, is one of the novel and improved features of the testing apparatus of the invention. The absence of several device trays for the same devices results in reduced cost and space requirements for the apparatus (i.e., reduced by the amount of money and space required for the handler of the prior art). It also results in significantly less handling time being taken to handle the trays. An additional novel feature of the present invention is that the TABI apparatus of this invention allows a burn-in process as well as other kinds of electrical tests to be performed within a single apparatus by independently transmitting test signals to the devices. Both of these novel features help to reduce the number of steps required in the back-end process and help make it possible to realize an in-line system for carrying out the entire back-end process.

When the TABI apparatus 100 is to be used for testing under high temperatures, such as in the burn-in process or the hot sort test, the TABI apparatus 100 of the present invention may further include a pre-heater 35. The pre-heater 35 applies heat to the semiconductor devices that are being loaded onto the rail 38 by the loader 34. On the other hand, the apparatus 100 may also include a pre-cooler 37 for the low temperature testing processes. The pre-heater 35 and pre-cooler 37 can alternatively be located in each test head 23.

Many different types of testers are available for use with the present invention. In particular, the TABI apparatus 100 in accordance with the present invention can employ a well-known tester made by the Schlumberger Co. The Schlumberger tester is basically equipped to accommodate four test heads, and is also able to allow sixty-four parallel fan-outs in each pin slice board (i.e., a timing board). It is therefore possible to perform the test and/or burn-in process on two hundred and fifty-six semiconductor devices at the same time. Additionally, an algorithmic pattern generator integrated circuit (APGIC) has been developed for attaining a test rate of about the 200 MHz level, and a high speed timing module with overall timing accuracy has also been developed. Moreover, the capacity of the simultaneous parallel test has increased to two hundred fifty-six parallel from sixty-four parallel. Accordingly, one may likewise expect an increase in the number of the devices which are capable of being tested at once in each test and burn-in apparatus of this invention.

Figure 5:
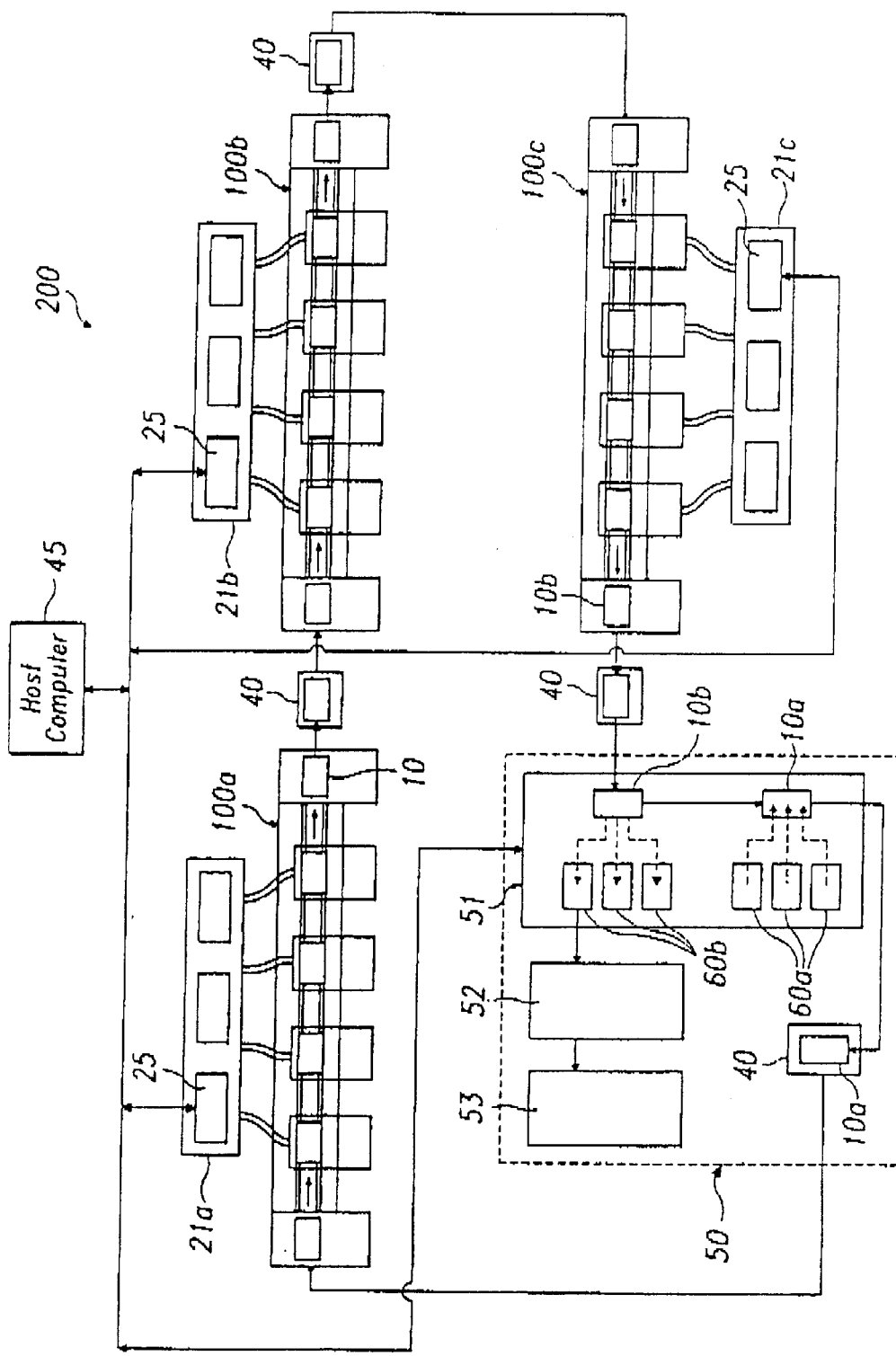
FIG. 5 is a schematic view of an in-line system employing the test and burn-in apparatus shown in FIG. 4, in accordance with the present invention.

FIG. 5 depicts the in-line system 200 in a back-end process. A plurality of TABI apparatuses according to the invention may form the in-line system 200, as illustrated in FIG. 5. Referring to FIG. 5, the in-line system 200 includes three TABI apparatuses 100a, 100b and 100c, and only one sorting unit 51. Each TABI apparatus 100a, 100b or 100c is substantially the same as the apparatus depicted in FIG. 4, however, each apparatus 100a, 100b or 100c in the in-line system 200 performs a different testing process than the other apparatuses. The sorting unit 51 provides the ability to sort the devices from each tested tray 10b and to transfer the sorted devices to a separate device tray 60b, according to test results of each testing process. The in-line system 200 may also include other units in the back-end process, such as a marking unit 52 and a visual inspection unit 53, due to the similar unit per hour (UPH) capability between them and the sorting unit 51. The sorting unit 51, the marking unit 52, and the visual inspection unit 53 are preferably provided in one machine 50.

The in-line system 200 further includes a transferring member 40 such as a cart, a transfer rail, a conveyer belt, or an automated guide vehicle (AGV), for example, as is well known in the art. The transferring member 40 receives one or more test trays 10 from one apparatus and supplies them to another apparatus, whereby multiple apparatuses are linked together as an in-line system by the activity of the transferring member 40. The device trays as used in the prior art are therefore not required since the test trays 10 are transferred directly by the transferring member 40 to each of the subsequent testing apparatuses. The in-line system according to this invention can have the preferred configuration shown in FIG. 5, however, other configurations can also easily be adapted. The apparatuses could be configured to stand in a row, for instance.

The three TABI apparatuses 100a, 100b and 100c of the in-line system 200 each perform different test steps. For example, a DC test and burn-in process may be performed by one apparatus, a room/cold test may be performed by another apparatus, and a hot sort test may be performed by yet another apparatus. Although any of the apparatuses could be configured to perform any of these test steps, it is preferable to configure the in-line system to perform the tests in the following order: first, the DC test and burn-in process; second, the room/cold test; and third, the hot sort test. Other sequences are also possible, however. For example, the room/cold test could be performed first, the DC test and burn-in process could be performed second, and the hot sort test could be performed third. Even performance of the burn-in process last is possible, provided the same test items as the room/cold test or the hot sort test are tested in the burn-in process.

The test results and other information obtained from each test step are sent to a host computer 45 through a network, and then transmitted to the sorting unit 51 in the form of test tray maps 120, as illustrated in FIG. 7. Referring to FIG. 7, the test tray maps 120 are log sheets in the form of computer files where the test results and other information from each of the tests is recorded. The test tray maps 120 may also be referred to as link-chained test tray maps. A more detailed description regarding the test tray maps 120 will follow later.

Again referring to FIG. 5, after the devices have been subjected to all of the test and burn-in processes, the sorting unit 51 proceeds to perform an off-line sorting so that all of the devices can be sorted from the tested trays 10b into an appropriate one of the device trays 60b. The sorting process is done according to the test results and other information recorded in the test tray maps 120 (see FIG. 7). The sorting unit 51 therefore performs two operations. One operation is moving the tested devices from the tested trays 10b to the device trays 60b according to the results of the test and burn-in processes; in other words, the above-described sorting process. The other operation performed by the sorting unit 51 is providing new devices, which have not yet been tested, from new device trays 60a to the new trays 10a. Dotted arrows in the sorting unit 51 represent the movement of the devices.

Following the sorting process, the device trays 60b are then supplied to the marking unit 52 by a conveyor belt, transfer rail, or other transferring member 40b, while the new trays 10a are supplied to the first TABI apparatus 100a by the transferring member 40. Contrary to the prior art in which loading and unloading of the devices is done at every tester, in the present invention, loading and unloading of the devices to transfer them between two trays is done only at the sorting unit 51.

Although the sorting unit 51 is illustrated as a single unit in FIG. 5, two or more sorting units can be selectively adapted for adjusting throughput to the TABI apparatus. Furthermore, the loading of new devices can alternatively be done in a place separate from the sorting unit 51. The separation of the sorting and loading functions is particularly preferable when dealing with large-sized lots having a large number of devices.

One of several advantages of the in-line system 200 according to this invention is the time savings resulting from the ability to quickly raise or drop testing temperature. The in-line system 200 also saves time in sorting the devices since the multiple sort steps of the prior art are reduced to a single step. Additionally, the reduction of the number of processes and the automation of the overall test process significantly reduces the possibility of damage during management of the devices and further protects against the problem of device damage caused by electrostatic discharge (ESD) resulting from workers or equipment coming into contact with the devices.

Figure 6:
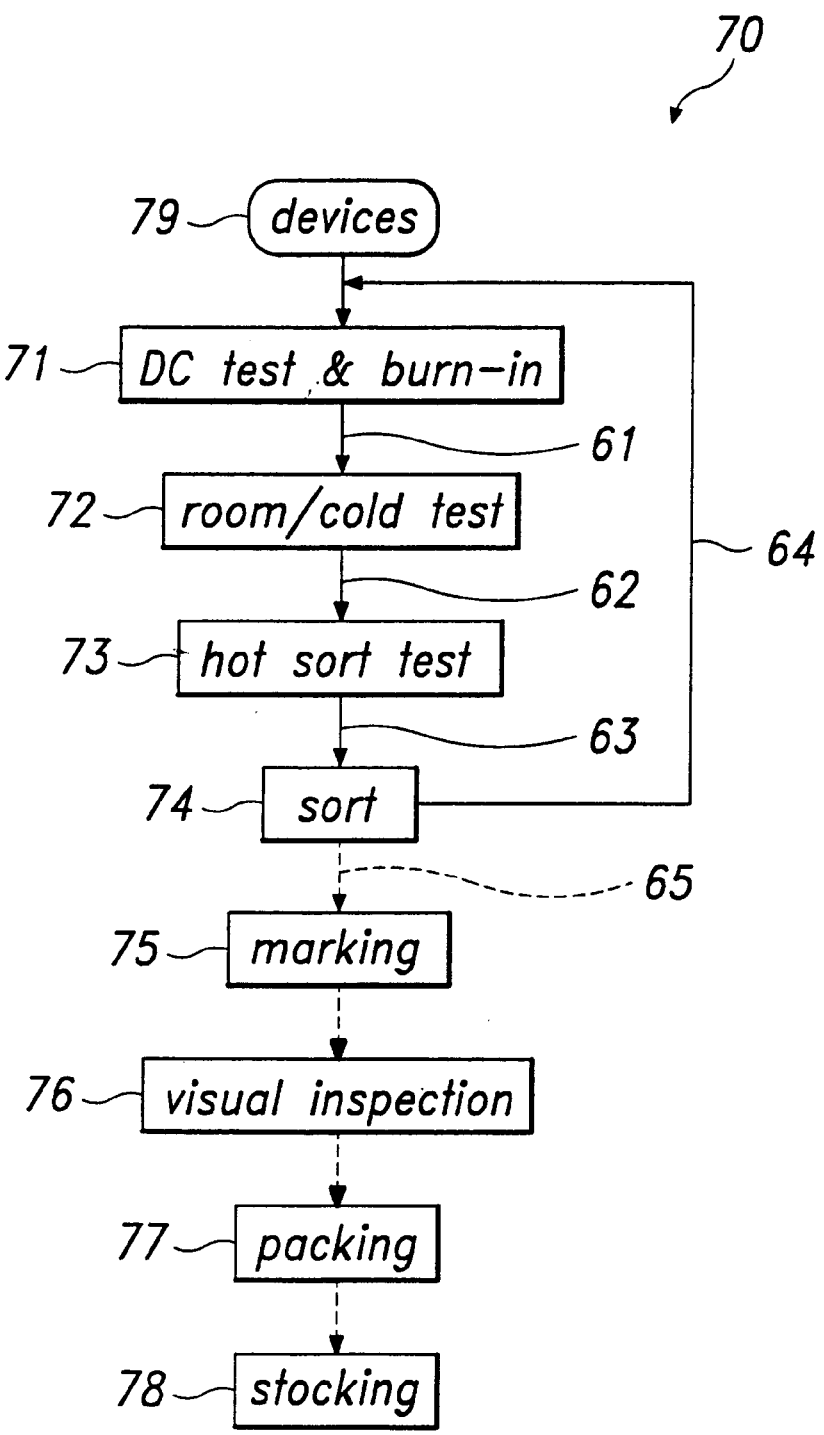
FIG. 6 is a flow chart illustrating a back-end process using the in-line system of FIG. 5, according to a preferred embodiment of the present invention.

FIG. 6 is a flow chart which illustrates an overall back-end process 70 which uses the in-line system 200 of the present invention as shown in FIG. 5. With further reference to FIG. 5, and with additional reference to FIG. 6, the back-end process will be discussed. Assembled devices which are ready to be tested are provided to the in-line system 200 of the back-end process during a loading step 79. During the loading step 79, the devices are loaded into the new trays 10a from the device trays 60a. The new trays 10a are then transported by a transferring member 40a to the first TABI apparatus 100a which performs a DC test and burn-in process 71 on the devices. The devices contained in the test trays 10 are next transported by the transferring member 40 to a second apparatus 100b where a room/cold test 72 is performed and then to a third apparatus 100c where a hot sort test 73 is performed.

Accordingly, when each test and/or burn-in process 71, 72 and 73 is done, the test trays 10 are transferred to next test step 72 or 73, or to a sort step 74 by the transferring member 40. In other words, the transferring member 40 receives the test trays 10 from an unloader of the apparatus 100a, 100b or 100c and then supplies the test trays 10 to a loader of the next apparatus. The arrows designated by reference numerals 61, 62 and 63 in FIG. 6 represent the transfer pathway of the test trays 10 between steps.

Meanwhile, control units 25 (see FIG. 4) of each apparatus 100a, 100b and 100c are electrically connected both to each other and to the sorting unit 51 through a network including the host computer 45. The test results and other information obtained during the test steps 71, 72, and 73 can therefore be transmitted to the sorting unit 51 from the apparatuses 100a, 100b and 100c via the host computer 45. As previously described, the test results and other information produced at the test steps 71, 72 or 73 are recorded on the test tray maps 120 (see FIG. 7). A sort step 74 of the devices is carried out according to these test tray maps 120, such that all good devices in the tested trays 10b will be shifted to the device trays 60b.

After the sort step 74, empty test trays on the sorting unit 51 become new trays 10a and are transferred back to the loading step 79 to receive new devices (i.e., a new lot) from new device trays 60a having a new lot number. The entire back-end process thereby begins for the new lot. The process of returning the new trays 10a from the sorting step 74 to the loading step 79 is indicated by the solid line 64. Each of the solid arrows in FIG. 6 indicates movement of the test trays 10, 10a or 10b.

Meanwhile, the device trays 60b, which receive the good devices from the sorting unit 51, are supplied to the marking unit 52 so that a marking step 75 can be performed. This transfer is indicated by dotted line 65. The dotted arrows in FIG. 6 indicate movement of the device trays 60a or 60b.

As mentioned earlier, one of the greatest benefits of this invention is that it allows the back-end process for testing and sorting semiconductor devices to proceed in an in-line system. One of the main reasons why the invented process is able to proceed successively, namely, as an in-line process, is that only one set of trays, i.e., the test trays, are required during the testing procedures. No transfer between trays is required between testing steps. Another substantial benefit of this invention, which will be more filly described below, is that data automation using the link-chained test tray maps feature allows for the performance of a single composite sort step, as opposed to the multiple sorting steps required by the prior art.

Referring to FIG. 7, the link-chained test tray maps 120 will now be discussed in fixer detail. FIG. 7 illustrates a group of test tray maps 120 and subgroups of maps (or map sheaves) 122 and 124 employed in the test process of the present invention. Test results and other information (or mapping signals) obtained from each of the test and/or burn-in processes are transmitted to the host computer 45 (see FIG. 5) via the control units 25 (see FIG. 4) of the TABI apparatuses. These mapping signals are processed by the host computer and recorded in the test tray maps 120. The test tray maps 120 therefore contain the testing information concerning each of the devices in the test trays, specifically, whether they passed or failed each of the tests. These maps are therefore essential when sorting the devices.

Generation and assignment of the test tray maps 120 begins with determining a lot ID number and a tray ID number. When the devices are loaded into the new tray 10a (see FIG. 4), the test tray receives the lot ID number from the operator. The test tray also has a tray ID number defined by tray ID holes 14a (see FIG. 2) or a bar code. The host computer 45 (see FIG. 5) determines the tray ID number by sensing the tray ID holes 14a or the bar code of the test tray. The tray ID holes 14a, each of which is either punched or filled, represent a binary number which is translated into a decimal tray ID number by the host computer 45 (see FIG. 5). For example, twelve tray ID holes can represent a decimal tray ID number of between 0000 to 4095.

Once the tray ID number is recognized, the computer generates the tray map 120 along with a corresponding a map file name. The map file name is a combination of the tray ID number and the lot ID number. Therefore, although the same test tray is used for each lot, and hence the same tray ID number, the map files for that tray are distinguished from one another using the lot ID number. Examples of the map file name in relation to the tray ID holes are demonstrated in Table 1.

TABLE 1

Examples of the map file name.

| Tray ID Holes | Tray ID Number | Lot ID Number | Map File Name |
| --- | --- | --- | --- |
| ○○○○○○○○○○○○ | T0000 | Lot 123 | Lot123.T0000 |
| ●●●●●●●●●●●● | T4095 | Lot 456 | Lot456.T4095 |
| ○○○○○○○○○○○● | T0001 | Lot 100 | Lot100.T0001 |
| ○○○○○○○○○○●● | T0003 | Lot 100 | Lot100.T003 |
| ○○○○○○○○○○●○ | T0002 | Lot 100 | Lot100.T002 |

Now returning to FIG. 7, after a first map 122 and a second map 124 are created from the results of two different test steps, the corresponding test results, recorded in both maps 122 and 124, are combined to generate a final sorting map using a linked algorithm. The off-line sorting process begins by the sorting unit receiving these composite test results from the final sorting map. For example, when the room/cold (or ambient) test is performed first and the hot sort test is performed later, the corresponding map files are named "Lotxxx.TxxxxA" and "Lotxxx.TxxxxH," respectively (where xxx represents the lot ID number, "T" indicates a test tray, xxxx represents the tray ID number, "A" designates the ambient test, and "H" designates the hot sort test). The final sorting map is stored in a final composite map file named "Lotxxx.TyyyS" (where yyy represents the number of test trays in one lot and "S" indicates a sorting map). A similar naming scheme can be employed in the rework (retest) process, where the final sorting map file name is associated with a name of the retest composite map files.

Each of the test maps 120 according to this embodiment has eight rows and eight columns, forming sixty-four cells, and corresponds to a respective one of the test trays, in which sixty-four devices are stored. Furthermore, the maps 122 and 124 separately contain the test results from two different test and burn-in apparatuses. In this example, one sheaf (or subgroup) of the maps 122 or 124 consists of four individual maps corresponding to the four test heads in one of the test and burn-in apparatuses. Test result numerals entered in the map 120 represent corresponding testing results or information obtained regarding the device at that location in the test tray. Specifically, the meaning of the test result numerals is as follows: a "φ" stands for socket-off, a "1–3" represents good devices, a "4–7" indicates failed devices, an "8" stands for open/short, and a "21" indicates a soft bin device (or special fail bin device) for a specified customer. A cell formed by any column and any row in the first map 122 will be designated below "(C, R)I," while a cell in the second map 124 will be designated "(C, R)II" (where "C" stands for the column number, "R" stands for the row number, and "I" and "II" are the map numbers corresponding to their respective tests). Thus, the test results corresponding to a single device are recorded at the same position in each of the test tray maps 120. The annotations in parentheses on the second map 124 indicate sorting commands (i.e., "1–3", "R$_1$", "R$_2$", "R$_3$", "BGD", "T$_{III}$", and "Bonus") according to the composite map results obtained by combining the first map 122 and the second map 124 into the fmal sorting map for off-line sorting. The final sorting map can normally be created by a link map algorithm which combines the test results for a given device from multiple test tray maps.

The sorting step utilizes the test tray maps 120 and is carried out by means of a test program which sorts the devices according to their tested characteristics. If the test result numeral of any cell (C, R)I in the first map 122 equals that of the corresponding cell (C, R)II in the second map 124, the test program is able to come to a definite decision regarding the state of the device corresponding to that cell location based on the test result numeral. Specifically, when the test result numeral in corresponding cells, i.e., (3, 5)I and (3, 5)II, in both the first and second map 122 and 124, respectively, is a "1", the device corresponding to that cell location (i.e., the third column and fifth row of the test tray) is confirmed to be a good device. A conclusion that the device is good is represented by the sorting command "1", "2" or "3", as shown in parentheses in the second map 124. Additionally, when the test result numeral in corresponding cells, i.e., (4, 2)I and (4, 2)II, is an "8", the corresponding device is determined to be opened/shorted and will therefore be scrapped during a sorting process. Similarly, when the test result numeral is a "4" in both cells, i.e., (5, 3)I and (5, 3)II, when the test result numeral is a "5" in both cells, i.e., (5, 6)I and (5, 6)II, or when the test result numeral is a "6" in both cells, i.e., (7, 3)I and (7, 3)II or (8, 3)I and (8, 3)II, the corresponding device is also determined to be a failed device and will be scrapped. The conclusion that the device is a failed device is represented by the sorting command "R$_3$" in parentheses in the second map 124.

On the other hand, if the test result numeral of any cell (C, R)I in the first map 122 differs from that of the corresponding cell (C, R)II in the second map 124, then the test program comes either to a decision to retest the corresponding device by a particular test, to a conclusion that it is good device, to a conclusion that it is a failed device, or to a decision to classify the device as in grade down (BGD), as is well known in the art. A decision to retest the device by the first test may be made when the test result numeral in the first map indicates a failed or open/shorted device but the test result numeral in the second map indicates a good device. For example, when the test result numeral in a cell in the first map, i.e., (5, 1)I, is a "5", indicating failure of the first test, but the test result numeral in the corresponding cell of the second map, i.e., (5, 1)I is a "3", passing the second test, the program concludes that the device should be retested by the first test. A decision to retest by the first test is designated by the sorting command "R$_1$". Similarly, when the test result numeral in a first map cell, i.e., (2, 1)I, is a "φ", which stands for socket-off, while in the corresponding cell of the second map, i.e., (2, 1)II, it is a "2", indicating a good device, the corresponding device will be also be retested by the first test.

A decision to retest by the second test is reached in a similar way. For example, if the test result numeral in a first map cell, i.e., (6, 5)I, is a "1" but the test result numeral in the corresponding cell, i.e., (6, 5)II, of the second map 124 is an "8", then the corresponding device will be retested by the second test. Similarly, if the first map cell and corresponding second map cell contain a "1" and a "φ", respectively (i.e., (3, 8)I and II), the decision will be made to retest the device by the second test. This decision to retest by the second test is designated by the sorting command "R$_2$".

When the test result numeral found in a first map cell is a "21," i.e., cell (1, 3)I, indicating a special fail bin for a specified customer under the first test, if the device corresponding to that cell location performs satisfactorily enough under a second test to receive a good test result numeral, i.e. a "2" in cell (1, 3)II, then that device will be sorted as a good device to any customers other than the specified customer. This decision is designated by the sort command "T$_{III}$" in the final sorting map. The device will be sorted as bin grade down (BGD) and given the sort command "BGD" when the test result numeral in a cell of one map, i.e., (6, 1)I, is a "5", indicating a failed device, but the test result numeral in a corresponding cell, i.e., (6, 1)II, is a "2", indicating a good device.

Bin numbers are normally divided in to two groups, one for good devices, the other for bad devices. Devices in a good bin are also divided in to different grades based on device speed, power consumption, and so on. Here, bin 1, bin2, and bin 3 represent good bins. In general, the numerals 1–8 represent a degree of desirability, e.g., bin2 represents a less desirable device (slower speed, more power consumption) than a "1".

R1, R2, and R3 are decided by a test engineer based on a combination of test steps (hot/cold) and pass/fail. Some possible combinations of 1–8 for R1, R2, and R3 are shown in Table 1A:

TABLE 1A

| Hot (or Cold) | Hot (or Cold) | |
| --- | --- | --- |
| Pass (1,2,3) | Fail (4,5,6,7,8) | R2 |
| Fail (4,5,6,7,8) | Pass (1,2,3) | R1 |
| Fail (4,5,6,7,8) | Fail (4,5,6,7,8) | R3 |

Unlike the prior art retest process, which is performed repeatedly using the same tester and handler after each of the several sorting steps, the retest process of the present invention is performed on retest designated devices following the composite sorting process. Alternatively, the retest process of the present invention can be performed all at one time for each of the various kinds of failed devices (i.e., "R$_1$", "R$_2$" and "R$_3$" devices). In this embodiment, the retest devices are shifted into the device trays during the sorting step so they can be retested. They are then loaded into retest trays and, after the testing process of one lot is finished, they are transported to the first test and burn-in apparatus. The retest trays are the same shape as the test trays, but preferably have a different color to facilitate distinction between the two types of trays. The previous test results corresponding to the failed devices are not discarded but are instead retained for complete compilation with the new test results. Therefore, the "R$_1$," "R$_2$," and "R$_3$" designations are retained throughout the retest process.

When the retest tray is supplied to the in-line system, the entire test process is repeated for each of the retest devices regardless of their particular type of fail. The retest map files are named Lotxxx.Rxxxx, Lotxxx.RxxxxA, Lot xxx.RxxxxH, and Lotxxx.RzzzS (where "zzz" represents the number of retest trays in one lot and "R" indicates retest maps). Once a final retest sorting map file Lotxxx.RzzzS is generated, the two final map files Lotxxx.TyyyS and Lotxxx.RzzzS are automatically combined into a cumulative map file named Lotxxx.F***S (where * equals y plus z) and also stored as a test data file Lotxxx.F***F. This test data file contains twice the amount of test information as the non-retest final sorting map files, and includes cumulative yield data. This enables the retest devices to be evaluated and sorted based on the cumulative results obtained from the combination of the initial testing process results and the retest results.

Figure 8:
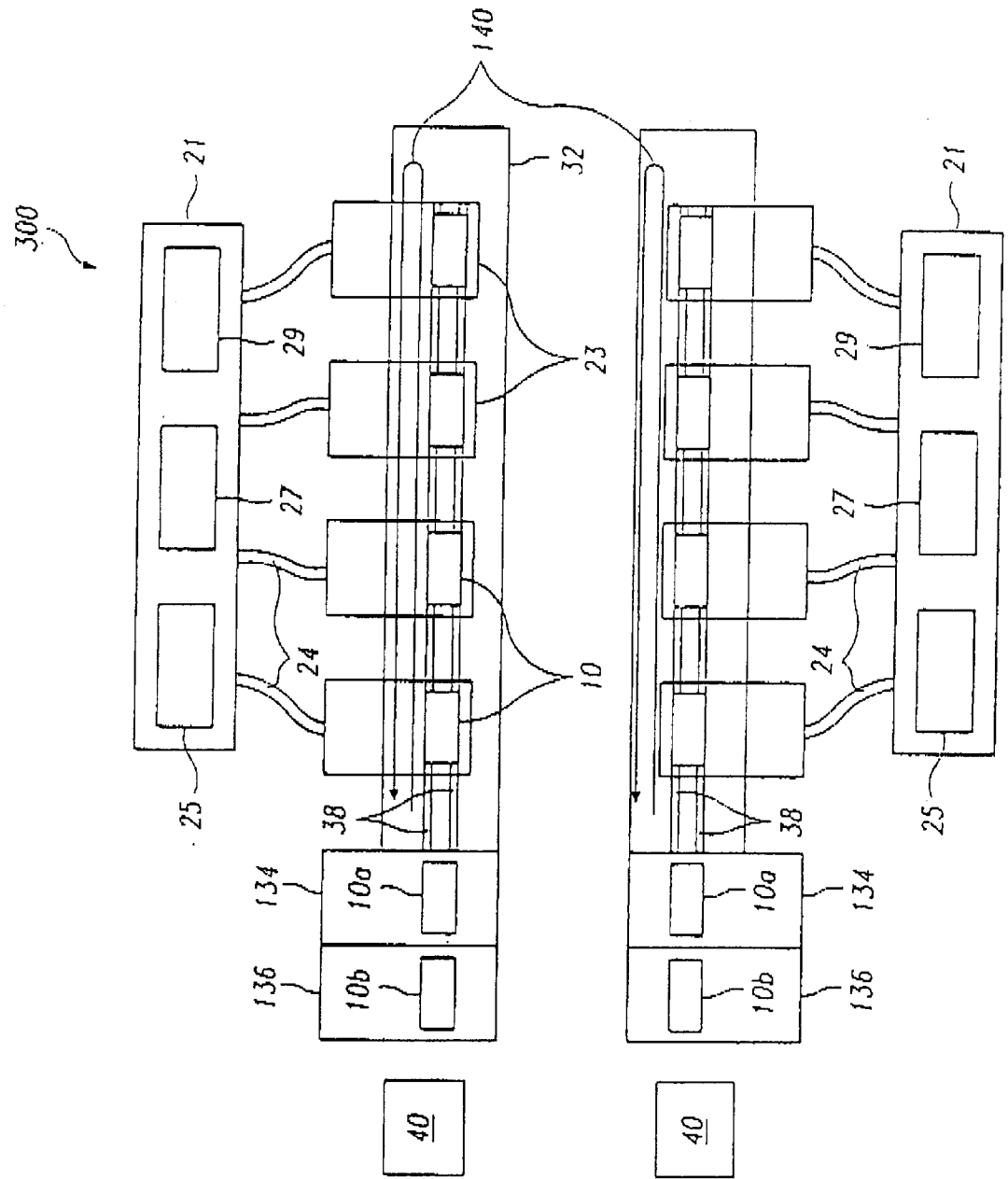
FIG. 8 is a schematic view of a second preferred embodiment of a test and burn-in apparatus in accordance with the present invention.

FIG. 8 is a schematic view of a second preferred embodiment of the test and burn-in (TABI) apparatus 300 in accordance with the present invention. As shown in FIG. 8, the TABI apparatus 300 has nearly the same structure as the TABI apparatus 100 according to the first preferred embodiment shown in FIG. 4. Unlike the previous embodiment, however, eight test heads 23 are provided rather than four. Additionally, there are two main frames 21, and two chambers 32 provided for each apparatus. Furthermore, the positions of both a loader 134 and an unloader 136 also differ from the previous embodiment. More specifically, the loader 134 and the unloader 136 are formed at the upper and lower parts of one end of the rail 38. For convenience of reference, the loader 134 and unloader 136 in FIG. 8 are illustrated side by side, however, they are actually stacked. Therefore, the rail 38 in the chamber 32 is formed having double layers, each layer of which is connected to either the loader 134 or the unloader 136. Reference numeral 140 represents the moving direction of the test trays (new trays 10a or tested trays 10b) in the double-layered rail 38. The positions of the loader 134 and the unloader 136 can be changed.

Figure 9:
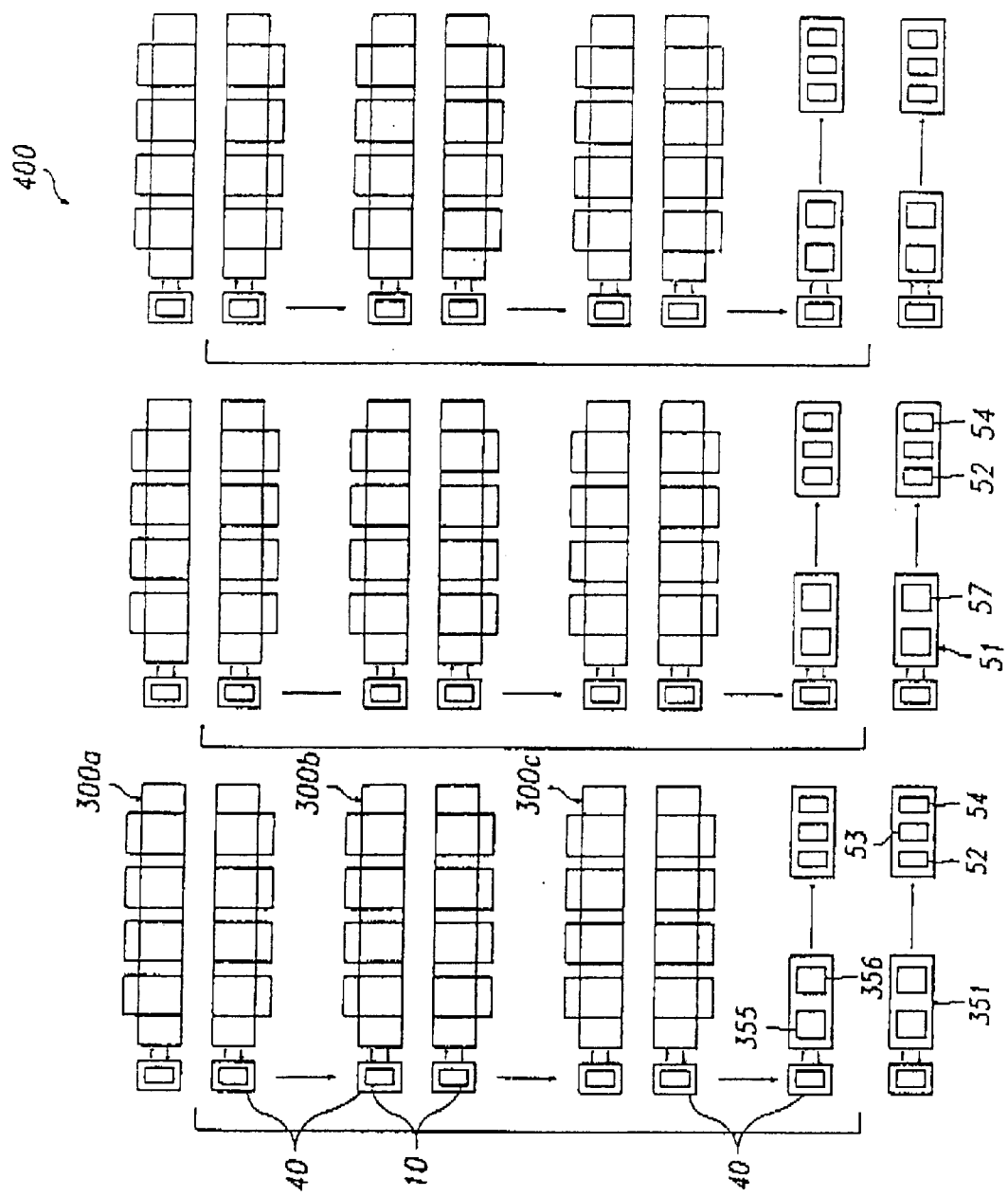
FIG. 9 is a schematic view of an in-line system employing the apparatus shown in FIG. 8, in accordance with the present invention.

An in-line system 400 which employs the TABI apparatus 300 of the second preferred embodiment, as shown in FIG. 8, is schematically depicted in FIG. 9. As seen from FIG. 9, the in-line system 400 of the back-end process includes three sub-in-line systems each of which are composed of three TABI apparatuses 300a, 300b and 300c, and one sorting unit 351, standing in a row. Test processes can proceed independently in each sub-in-line system.

The in-line system 400 further includes a transferring member 40 which goes from and returns to the same side of the test apparatuses due to the similar positioning of their loaders and unloaders. The sorting unit 351 is made up of double units. The in-line system 400 of this embodiment can be maximized through appropriate modification of the configuration of several units including the sorting unit, namely, by adjusting throughput of all apparatuses and units. Reference numerals 355 and 356 in the sorting unit 351 refer to the unloading part of the tested devices and the loading part of new devices. The operation of these elements is similar to that of the first preferred embodiment described with reference to FIG. 5 and a redundant description here is therefore omitted.

As previously described, the prior art burn-in tester of JEC Co. is not able to perform several test items with a short cycle such as pattern sensitivity, Vcc margin, refresh, or speed sorting. Therefore, the room/cold test and the hot sort test have been carried out separately from the burn-in process. Remarkably, the TABI apparatus and the in-line system of this invention permit the room/cold test, the hot sort test, and the burn-in process to all be performed with the same platform. One of the reasons why this improvement is possible is that the test rate of the burn-in process can be improved up to the order of that of the room/cold test or the hot sort test. This improvement also enables the employment of test trays instead of the burn-in board. In particular, in the embodiment where the Schiumberger Co. tester is used, it is possible to perform the testing of test items requiring a shorter cycle such as a 200 MHz test rate and a 1 ns transition time. Moreover, the present invention can reduce the cycle period in the burn-in process as shown in Tables 2 and 3.

TABLE 2

Information List of Conventional Burn-in

| Device | Burn-In Time (hours) | Vcc (V) | Temperature (° C.) | Cycle Period (ns) |
|---|---|---|---|---|
| 16M DRAM | 2 | 5.5 | 125 | 500 |
| 64M DRAM | 12 | 6.3 | 125 | 2000 |
| 16M Sync DRAM | 2 | 5.5 | 125 | 900 |
| 64M Sync DRAM | 12 | 5.5 | 125 | 900 |
| 1M Sync SRAM | 2 | 5.5 | 125 | 1000 |
| 2M Sync SRAM | 2 | 5.5 | 125 | 1000 |

TABLE 3

Information List of Invented Burn-in

| Device | Burn-In Time (sec) | Vcc (V) | Temperature (° C.) | Cycle Period (ns) | The Rate of Reduction |
|---|---|---|---|---|---|
| 16M DRAM | 600 | 5.5 | 125 | 90 | 1/5.5 |
| 64M DRAM | 360 | 6.3 | 125 | 90 | 1/22 |
| 16M Sync DRAM | 240 | 5.5 | 125 | 30 | 1/30 |
| 64M Sync DRAM | 1440 | 5.5 | 125 | 30 | 1/30 |
| 1M Sync SRAM | 72 | 5.5 | 125 | 10 | 1/100 |
| 2M Sync SRAM | 72 | 5.5 | 125 | 10 | 1/100 |

Tables 2 and 3 set forth only the burn-in time itself at 125° C. Accordingly, if incidental time such as the time taken in performing the sorting step were also to be considered, the actual processing time of the conventional burn-in of Table 2 would be much longer. Contrary to this, the actual process time of the burn-in process of the present invention as disclosed in Table 3 is not as drastically different from the burn-in time itself as is the actual processing time of the prior art, since there is only one sorting step and transfer between trays is unnecessary.

As described so far, the test and burn-in apparatus, the in-line system and the method according to the present invention produce excellent outcomes in the back-end process for the manufacture of semiconductor devices. Namely, an apparatus and system are provided which occupy much less space, offer a shorter turn around time (TAT), provide for a reduction of movement, reduce the tester and handler cost, improve yield and quality, reduce manpower requirements for maintenance and operation, allow for the removal of human error, improve the work in process (WIP), allow part-to-part failure analysis by data tracking and comparisons, provide accurate data feedback to other divisions, and so on.

Throughout the drawings and specification, preferred embodiments of the present invention have been disclosed which, although specific terms are employed, are used merely in a generic and descriptive sense and should not be considered as limiting in any way the spirit and scope of the invention as set forth in the following claims.

What is claimed is:

1. A test and burn-in apparatus, comprising:

a rail for transferring a plurality of test trays, each test tray configured to contain a plurality of semiconductor devices;

a loader for loading the test trays onto the rail;

an unloader for unloading the test trays from the rail;

a chamber through which the rail traverses, so that the semiconductor devices contained in the test trays loaded onto the rail can be subjected to a test and/or burn-in process within the chamber; and a plurality of test heads associated with the chamber, wherein each test head is electrically connected to a corresponding test tray within the chamber in order to perform the test and/or burn-in process.

2. The test and burn-in apparatus according to claim 1, further comprising:

a main frame comprising a control unit which is capable of being electrically connected to the test heads.

3. The test and burn-in apparatus according to claim 2, wherein the main frame further comprises a coolant refrigerator unit configured to cool down the test heads for the test and/or burn-in process.

4. The test and burn-in apparatus according to claim 1, wherein the number of the test heads is four.

5. The test and burn-in apparatus according to claim 4, wherein each of the test heads is configured to perform the test and/or burn-in process for sixty-four semiconductor devices located in the corresponding test tray.

6. The test and burn-in apparatus according to claim 1, wherein each of the semiconductor devices comprises a semiconductor chip package with gull-wing leads or a chip scaled package.

7. The test and burn-in apparatus of claim 1 wherein the loader and unloader are located at opposite ends of the rail.

8. The test and burn-in apparatus of claim 1 wherein the loader and unloader are located at the same end of the rail.

9. The test and burn-in apparatus of claim 1 wherein the loader and unloader are stacked.

10. The test and burn-in apparatus of claim 1 wherein the rail has double layers.

* * * * *

UNITED STATES PATENT AND TRADEMARK OFFICE
CERTIFICATE OF CORRECTION

PATENT NO.   : 6,313,652 B1
DATED        : November 6, 2001
INVENTOR(S)  : Maeng It is certified that error appears in the above-identified patent and that said Letters Patent is hereby corrected as shown below:

Column 6,
Line 21, "semiconductor, devices" should read -- semiconductor devices --.

Column 7,
Line 13, "$\mu$BGA" should read -- $\mu$-BGA --.

Column 11,
Line 60, "filly" should read -- fully --.
Line 66, "fixer" should read -- further --.

Column 13,
Line 27, "fmal" should read -- final --.
Line 64, "as in grade" should read -- as bin grade --.

Column 16,
Line 14, "Schiumberger" should read -- Schlumberger --.

Signed and Sealed this

Seventeenth Day of September, 2002

Attest:

JAMES E. ROGAN
Attesting Officer    Director of the United States Patent and Trademark Office